United States Patent
Kim et al.

(10) Patent No.: US 11,567,593 B2
(45) Date of Patent: Jan. 31, 2023

(54) DISPLAY DEVICE INCLUDING A TOUCH PANEL

(71) Applicant: SAMSUNG DISPLAY CO., LTD., Yongin-si (KR)

(72) Inventors: Jeonkyoo Kim, Seoul (KR); Dong Won Lee, Suwon-si (KR); Jaekeun Lim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 12 days.

(21) Appl. No.: 16/573,539

(22) Filed: Sep. 17, 2019

(65) Prior Publication Data
US 2020/0150805 A1 May 14, 2020

(30) Foreign Application Priority Data
Nov. 8, 2018 (KR) .......................... 10-2018-0136365

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/04164* (2019.05); *H01L 27/323* (2013.01); *G06F 1/3262* (2013.01); *G06F 1/3265* (2013.01); *G06F 3/0416* (2013.01); *G06F 3/0445* (2019.05); *G06F 3/0446* (2019.05); *G06F 3/04166* (2019.05);
(Continued)

(58) Field of Classification Search
CPC .... G06F 3/0412; G06F 3/044; G06F 3/04164; G06F 2203/04106; G06F 1/3262; G06F 3/04166; G06F 3/0446; G06F 3/0416; G06F 1/3265; G06F 3/041661; G06F 3/041662; G06F 2203/04108; H01L 27/323; G09G 2320/103; G09G 2330/021; G09G 2340/0435
See application file for complete search history.

(56) References Cited

U.S. PATENT DOCUMENTS

2010/0321305 A1* 12/2010 Chang .................. G06F 3/0445
345/173
2011/0157068 A1* 6/2011 Parker .................. G06F 3/0446
345/174

(Continued)

FOREIGN PATENT DOCUMENTS

KR  10-2017-0072095  6/2017
KR  10-2018-0033058  4/2018

*Primary Examiner* — Douglas M Wilson
(74) *Attorney, Agent, or Firm* — F. Chau & Associates, LLC

(57) ABSTRACT

A display device includes a display panel that includes a plurality of pixels, a touch panel that includes a plurality of driving lines and a plurality of sensing lines, a display driver that drives the display panel at a first display frame rate in a normal driving mode, and that drives the display panel at a second display frame rate lower than the first display frame rate in a low power driving mode, and a touch controller that drives the touch panel with a mutual capacitance sensing method in the normal driving mode, and that drive the touch panel with a self capacitance sensing method in the low power driving mode.

7 Claims, 16 Drawing Sheets

(51) Int. Cl.
*H01L 27/32* (2006.01)
*G06F 1/3234* (2019.01)

(52) U.S. Cl.
CPC .. *G06F 3/041661* (2019.05); *G06F 3/041662* (2019.05); *G06F 2203/04106* (2013.01); *G06F 2203/04108* (2013.01); *G09G 2320/103* (2013.01); *G09G 2330/021* (2013.01); *G09G 2340/0435* (2013.01)

(56) References Cited

U.S. PATENT DOCUMENTS

| | | | |
|---|---|---|---|
| 2012/0105357 A1* | 5/2012 | Li | G06F 1/3262 345/174 |
| 2016/0098141 A1* | 4/2016 | Kang | G06F 1/3265 345/174 |
| 2016/0357320 A1* | 12/2016 | Ito | G06F 3/038 |
| 2017/0153736 A1* | 6/2017 | Kim | G06F 3/04166 |
| 2017/0160868 A1* | 6/2017 | Kim | G06F 3/04166 |
| 2017/0255295 A1* | 9/2017 | Tanemura | G06F 1/3262 |
| 2018/0088706 A1* | 3/2018 | Tanemura | G06F 3/04164 |
| 2020/0089360 A1* | 3/2020 | Sen | G06F 3/04886 |
| 2020/0409491 A1* | 12/2020 | Maharyta | G06F 3/04166 |

\* cited by examiner

DISPLAY DEVICE INCLUDING A TOUCH PANEL

CROSS-REFERENCE TO RELATED APPLICATION(S)

This application claims priority under 35 USC § 119 from, and the benefit of, Korean Patent Application No. 10-2018-0136365, filed on Nov. 8, 2018 in the Korean Intellectual Property Office (KIPO), the contents of which are herein incorporated by reference in their entirety.

BACKGROUND

1. Technical Field

Exemplary embodiments of the present inventive concept directed to display devices, and more particularly to display devices that include touch panels.

2. Discussion of the Related Art

Touch panels or touch screens are widely used in electronic devices to detect an input action or an event by a user. Typically, a touch panel detects the presence and location of a user's touch by generating an electrical signal when the touch panel is touched by a finger, a stylus pen, or etc. The touch panel may be mounted on a display panel, such as an organic light emitting diode (OLED) display panel, a liquid crystal display (LCD) panel, etc., or may be formed within the display panel. The touch panel may be classified as, e.g., a resistive touch panel, a capacitive touch panel, an electromagnetic touch panel, an infrared touch panel, a surface acoustic wave (SAW) touch panel, a near field imaging (NFI) touch panel, etc. Of these touch panels, the capacitive touch panel has been most widely used because of its rapid response speed and thin profile.

To reduce power consumption, a display device that supports a low power driving mode has been recently developed. In a low power driving mode, the display panel is driven at a display frame rate slower than that of a normal driving mode. It is desirable to drive not only the display panel but also the touch panel for a low power driving mode.

SUMMARY

Some exemplary embodiments provide a display device capable of driving a touch panel suitably for a low power driving mode.

According to exemplary embodiments, there is provided a display device that includes a display panel that includes a plurality of pixels, a touch panel that includes a plurality of driving lines and a plurality of sensing lines, a display driver that drives the display panel at a first display frame rate in a normal driving mode, and that drives the display panel at a second display frame rate lower than the first display frame rate in a low power driving mode, and a touch controller that drives the touch panel with a mutual capacitance sensing method in the normal driving mode, and that drives the touch panel with a self capacitance sensing method in the low power driving mode.

In exemplary embodiments, a driving mode of the display device may change from the normal driving mode to the low power driving mode when a still image is displayed by the display panel.

In exemplary embodiments, a driving mode of the display device may change from the normal driving mode to the low power driving mode when an electronic device that includes the display device is in a sleep state.

In exemplary embodiments, the touch controller may detect proximity of a conductive object to the touch panel by driving the touch panel with the self capacitance sensing method in the low power driving mode, and a driving mode of the display device may change from the low power driving mode to the normal driving mode when proximity of the conductive object is detected.

In exemplary embodiments, the touch controller may drive the plurality of sensing lines of the touch panel with the self capacitance sensing method in the low power driving mode.

In exemplary embodiments, the touch controller may include a transmitting block coupled to the plurality of driving lines, where the transmitting block sequentially transmits first driving signals to the plurality of driving lines in the normal driving mode, and a transmitting/receiving block coupled to the plurality of sensing lines, where the transmitting/receiving block generates first touch data by sensing changes of mutual capacitances between the plurality of driving lines and the plurality of sensing lines in the normal driving mode, and generates second touch data by substantially simultaneously transmitting second driving signals to the plurality of sensing lines and by sensing changes of self capacitances of the plurality of sensing lines in the low power driving mode.

In exemplary embodiments, the touch controller may drive the plurality of driving lines of the touch panel with the self capacitance sensing method in the low power driving mode.

In exemplary embodiments, the touch controller may include a transmitting/receiving block coupled to the plurality of driving lines, where the transmitting/receiving block sequentially transmits first driving signals to the plurality of driving lines in the normal driving mode, and generates second touch data by substantially simultaneously transmitting second driving signals to the plurality of driving lines and by sensing changes of self capacitances of the plurality of driving lines in the low power driving mode, and a receiving block coupled to the plurality of sensing lines, where the receiving block generates first touch data by sensing changes of mutual capacitances between the plurality of driving lines and the plurality of sensing lines in the normal driving mode.

According to exemplary embodiments, there is provided a display device that includes a display panel that includes a plurality of pixels, a touch panel that includes a plurality of driving lines and a plurality of sensing lines, a display driver that drives the display panel at a first display frame rate in a normal driving mode, and that drives the display panel at a second display frame rate lower than the first display frame rate in a low power driving mode, and a touch controller that drives an entire touch region of the touch panel in the normal driving mode, and that drives a partial touch region of the touch panel in the low power driving mode.

In exemplary embodiments, the partial touch region may be determined based on a touch pattern that represents previous touch positions.

In exemplary embodiments, the touch controller may include a touch pattern memory that stores the touch pattern.

In exemplary embodiments, the touch controller may further include a transmitting block coupled to the plurality of driving lines, where the transmitting block sequentially transmits driving signals to the plurality of driving lines, and a receiving block coupled to the plurality of sensing lines, where the receiving block generates touch data by sensing changes of mutual capacitances between the plurality of driving lines and the plurality of sensing lines.

In exemplary embodiments, in the low power driving mode, the touch controller may not drive a remaining touch region other than the partial touch region of the touch panel.

In exemplary embodiments, in the low power driving mode, the touch controller may drive the partial touch region at a first touch frame rate, and may drive a remaining touch region other than the partial touch region of the touch panel at a second touch frame rate lower than the first touch frame rate.

In exemplary embodiments, when a touch to the touch panel is detected in the low power driving mode, a driving mode of the display device may change from the low power driving mode to the normal driving mode.

According to exemplary embodiments, there is provided a display device that includes a display panel that includes a plurality of pixels, a touch panel that includes a plurality of driving lines and a plurality of sensing lines, a display driver that drives the display panel at a first display frame rate in a normal driving mode, and that drives the display panel at a second display frame rate lower than the first display frame rate in a low power driving mode, and a touch controller that drives the touch panel, and that changes at least one of a sensing method, a touch region of the touch panel or a touch frame rate when a driving mode of the display device changes between the normal driving mode and the low power driving mode.

In exemplary embodiments, in the normal driving mode, the touch controller may drive the touch panel with a mutual capacitance sensing method, and, in the low power driving mode, the touch controller may drive the touch panel with a self capacitance sensing method by changing the sensing method from the mutual capacitance sensing method to the self capacitance sensing method.

In exemplary embodiments, in the normal driving mode, the touch controller may drive an entire touch region of the touch panel, and, in the low power driving mode, the touch controller may drive a partial touch region of the touch panel by changing the touch region from the entire touch region to the partial touch region.

In exemplary embodiments, in the normal driving mode, the touch controller may drive the touch panel at a first touch frame rate, and in the low power driving mode, the touch controller may drive the touch panel at a second touch frame rate lower than the first touch frame rate by changing the touch frame rate from the first touch frame rate to the second touch frame rate.

In exemplary embodiments, in the normal driving mode, the touch controller may drive an entire touch region of the touch panel at a first touch frame rate, and, in the low power driving mode, the touch controller may drive a partial touch region of the touch panel at the first touch frame rate, and may drive a remaining touch region other than the partial touch region of the touch panel at a second touch frame rate lower than the first touch frame rate.

As described above, a display device according to exemplary embodiments may drive, in a low power driving mode, a display panel at a second display frame rate lower than a first display frame rate of a normal driving mode, thereby reducing power consumption.

Further, a display device according to exemplary embodiments may change at least one of a sensing method, a touch region of a touch panel or a touch frame rate when a driving mode changes, thereby suitably driving the touch panel for the low power driving mode.

DETAILED DESCRIPTION OF EXEMPLARY EMBODIMENTS

Hereinafter, exemplary embodiments of the present inventive concept will be explained in detail with reference to the accompanying drawings.

Figure 1:
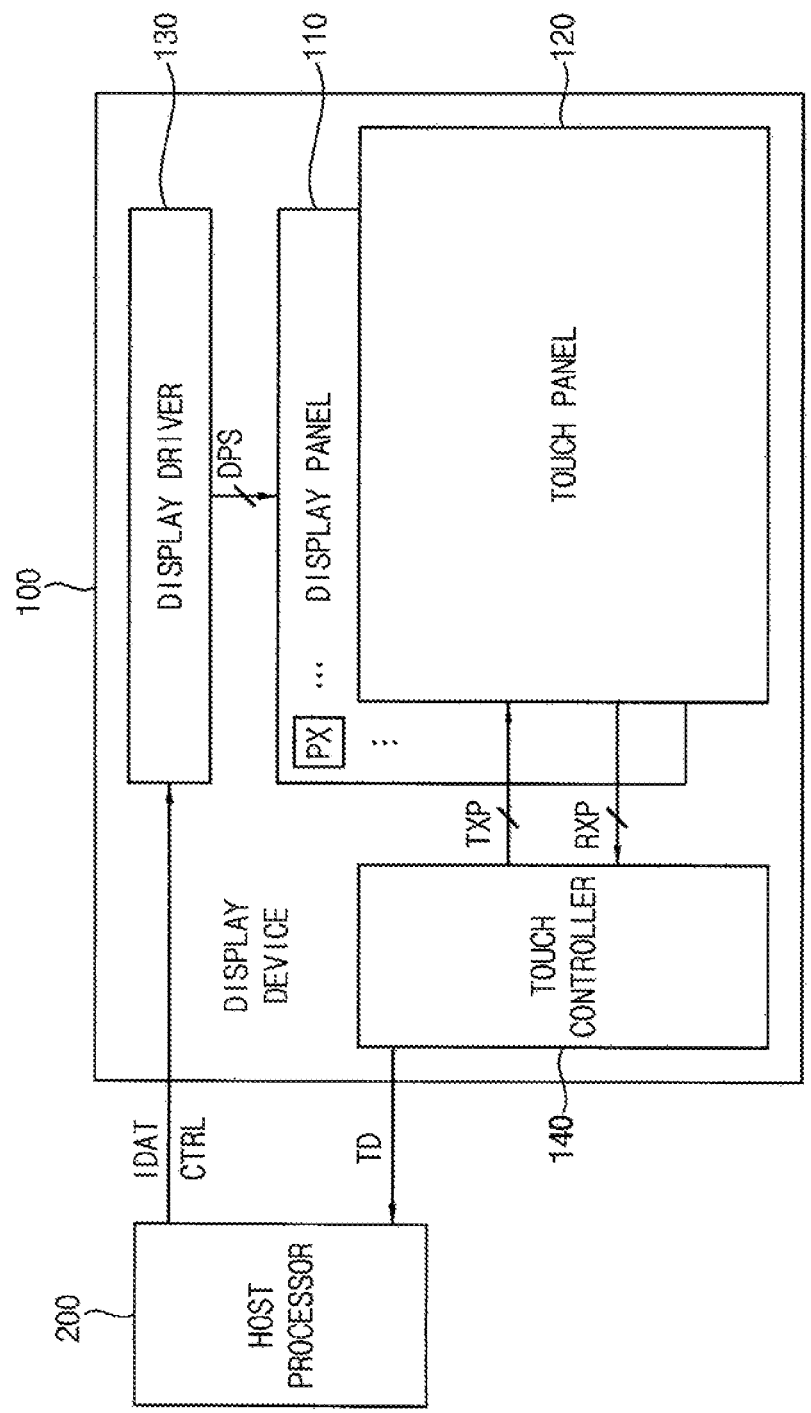
FIG. 1 is a block diagram of a display device according to exemplary embodiments.
Figure 2:
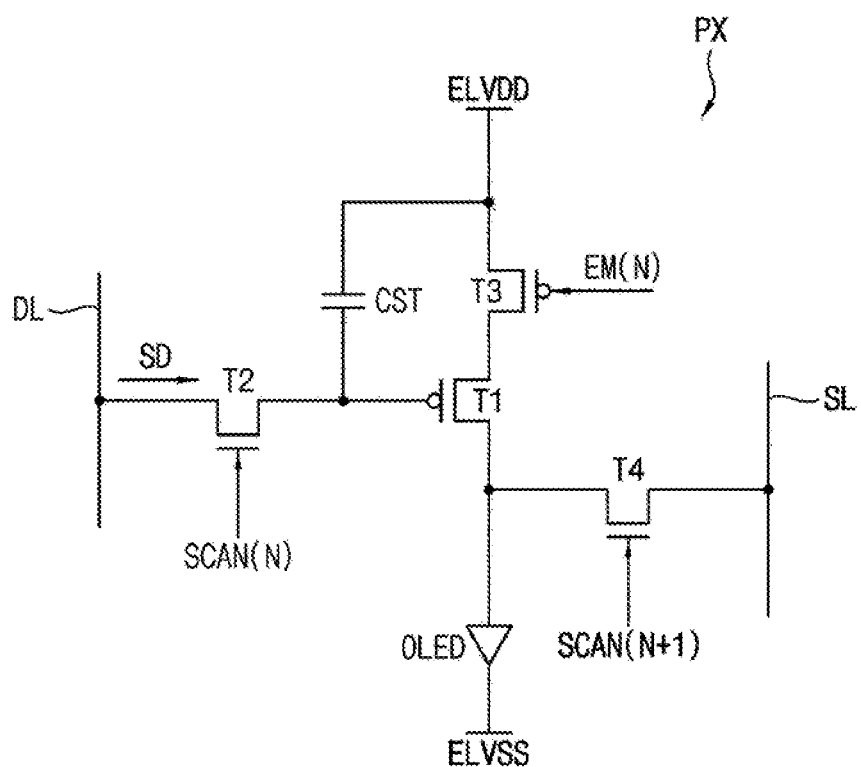
FIG. 2 is a circuit diagram of an example of a pixel included in a display device according to exemplary embodiments.
Figure 3A:
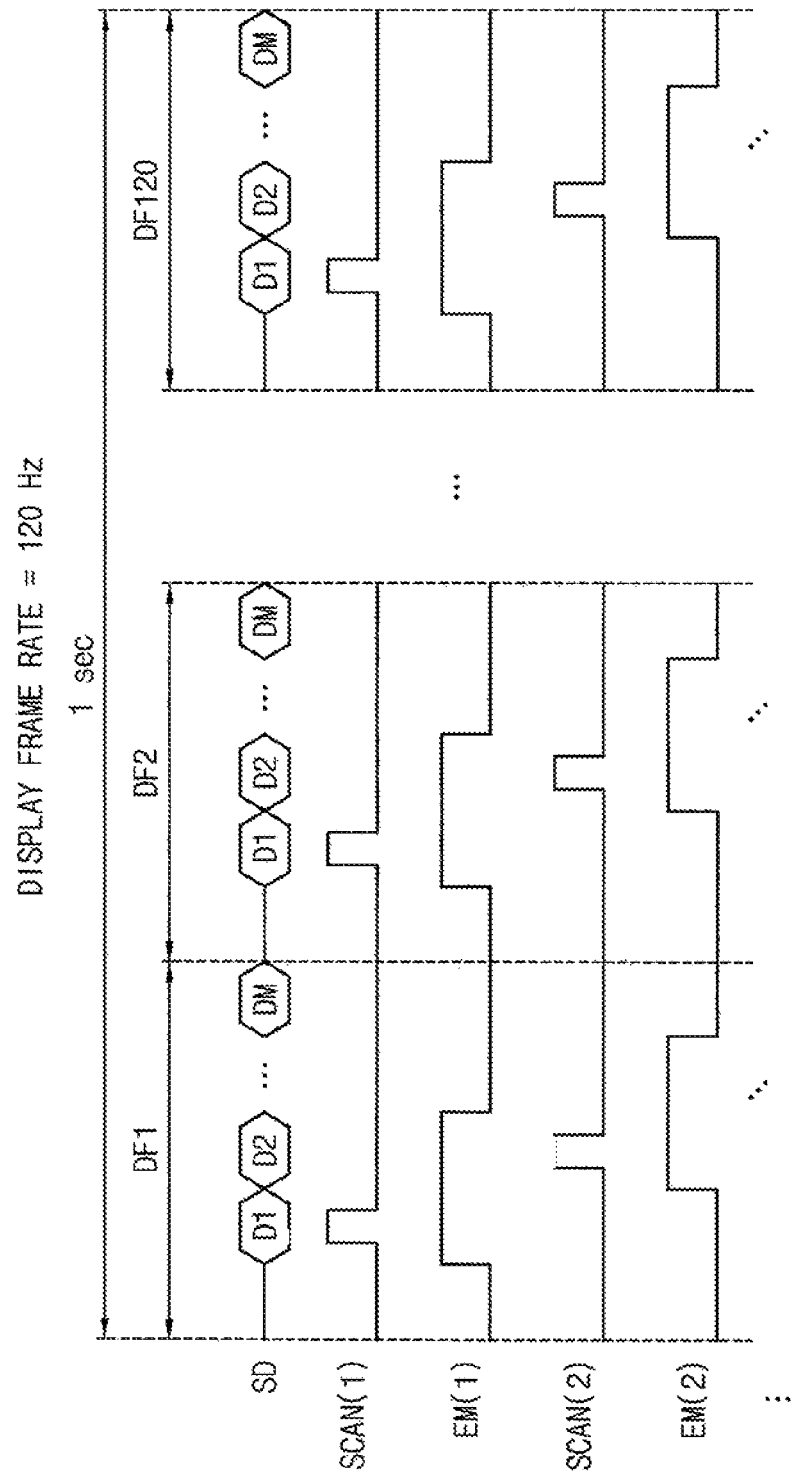
FIG. 3A is a timing diagram that describes an example of an operation of a display driver in a normal driving mode according to exemplary embodiments.
Figure 3B:
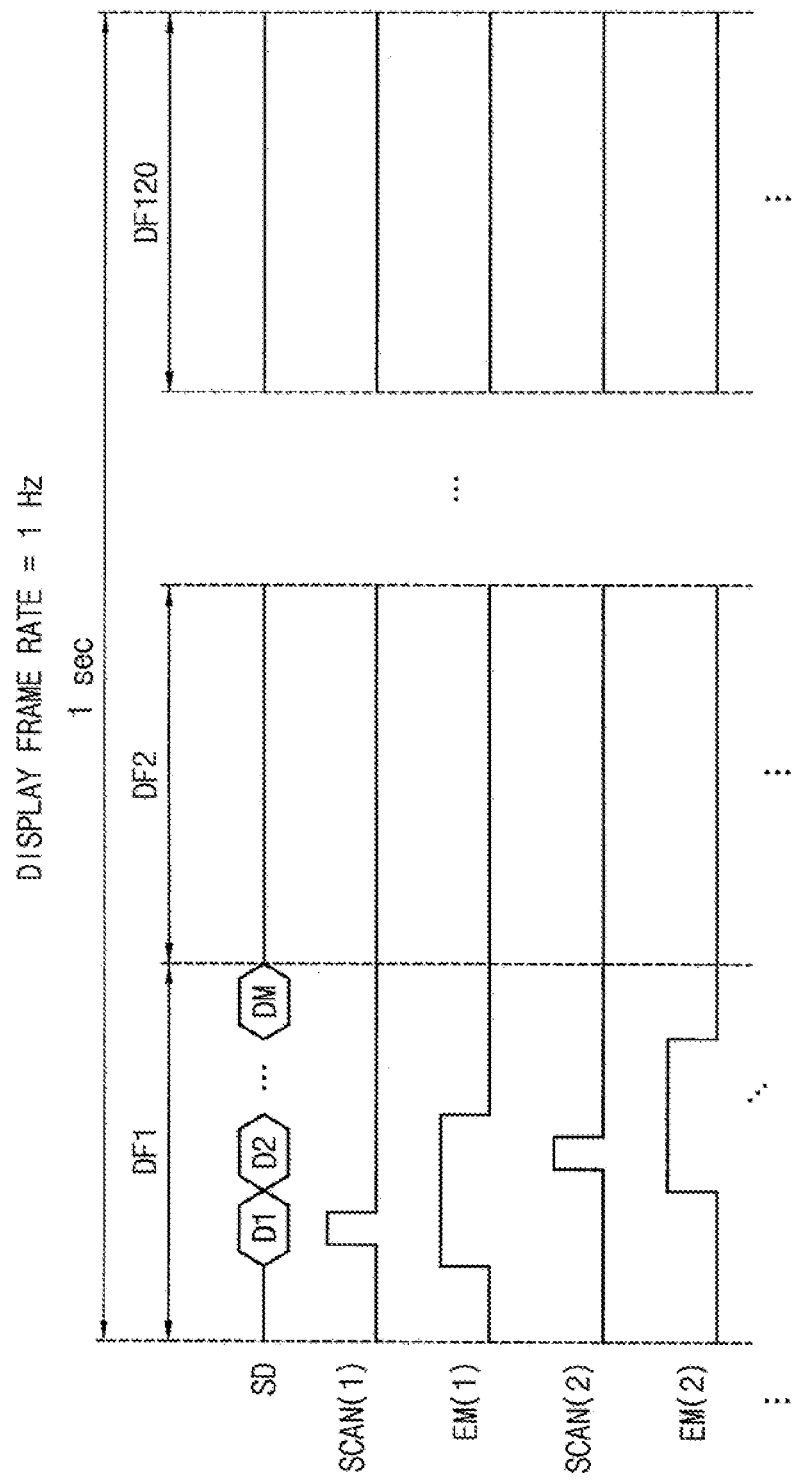
FIG. 3B is a timing diagram that describes an example of an operation of a display driver in a low power driving mode according to exemplary embodiments.
Figure 4A:
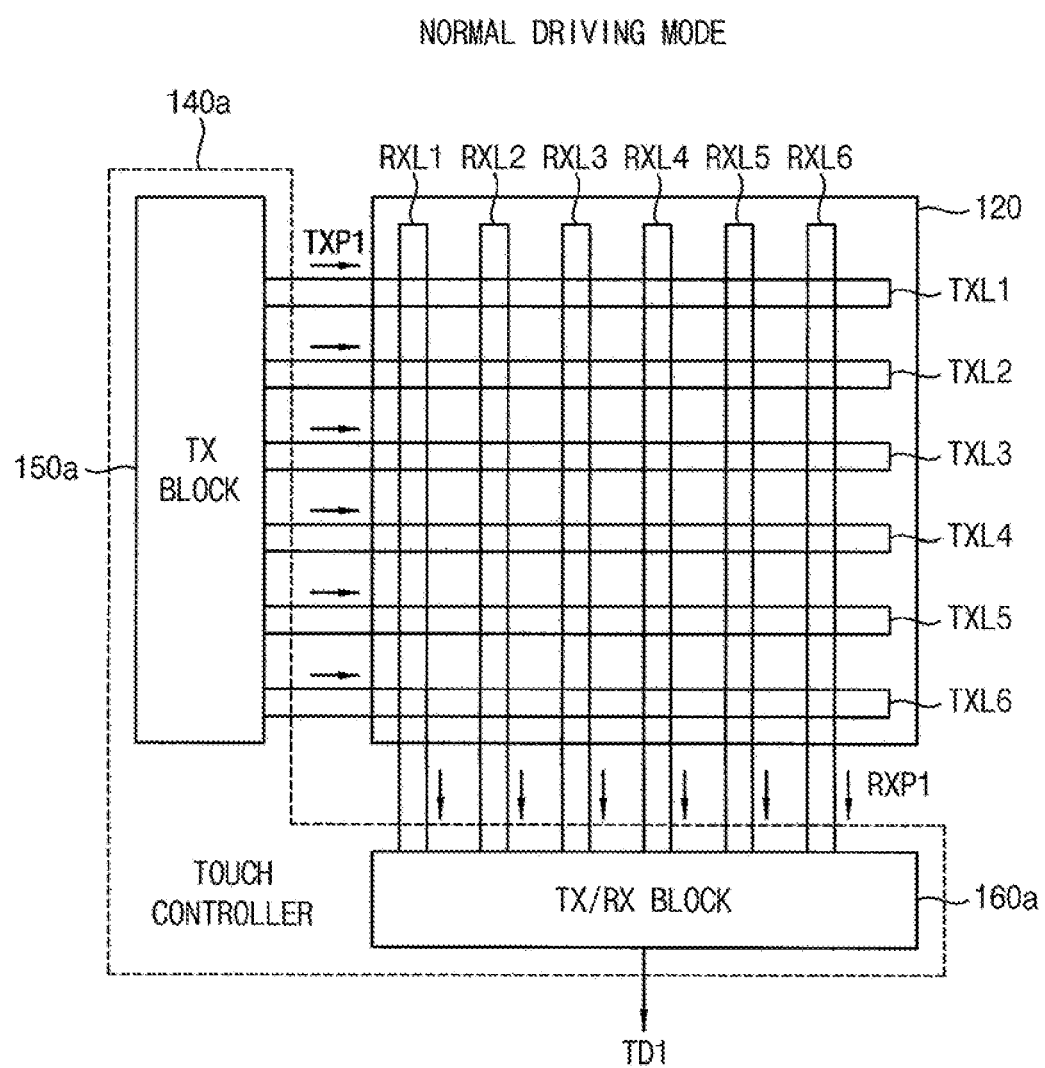
FIG. 4A is a timing diagram that describes an example of an operation of a touch controller in a normal driving mode according to exemplary embodiments.
Figure 4B:
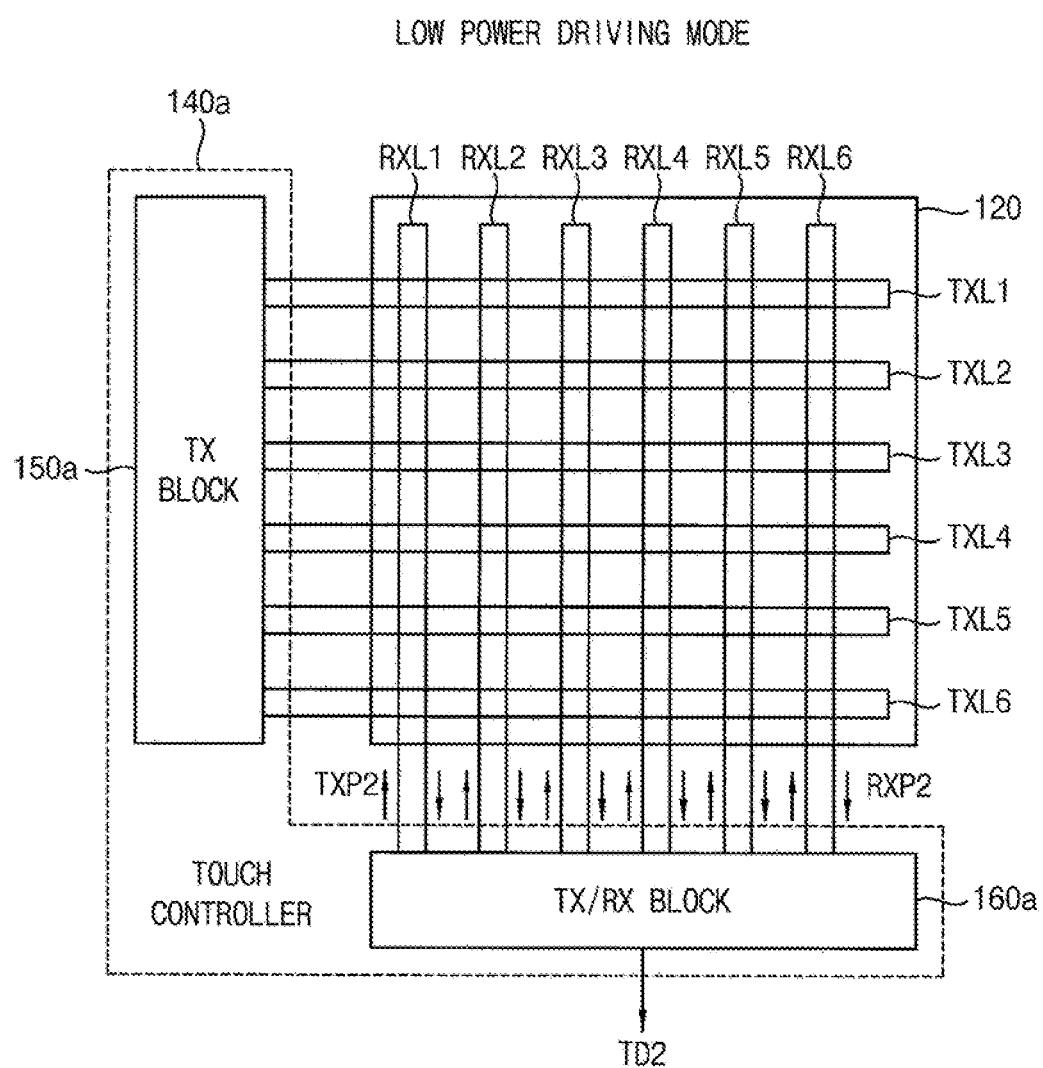
FIG. 4B is a timing diagram that describes an example of an operation of a touch controller in a low power driving mode according to exemplary embodiments.
Figure 5A:
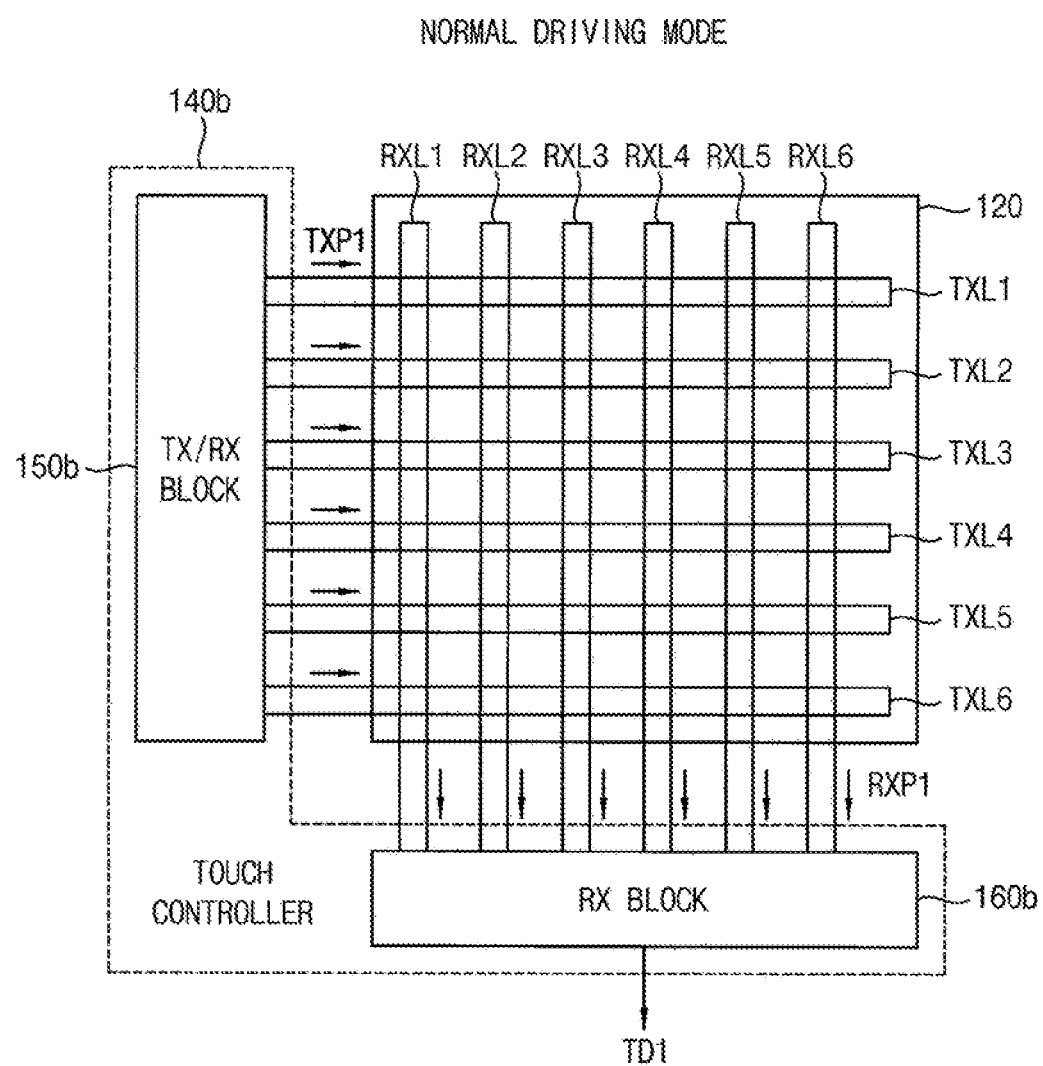
FIG. 5A is a timing diagram that describes another example of an operation of a touch controller in a normal driving mode according to exemplary embodiments.
Figure 5B:
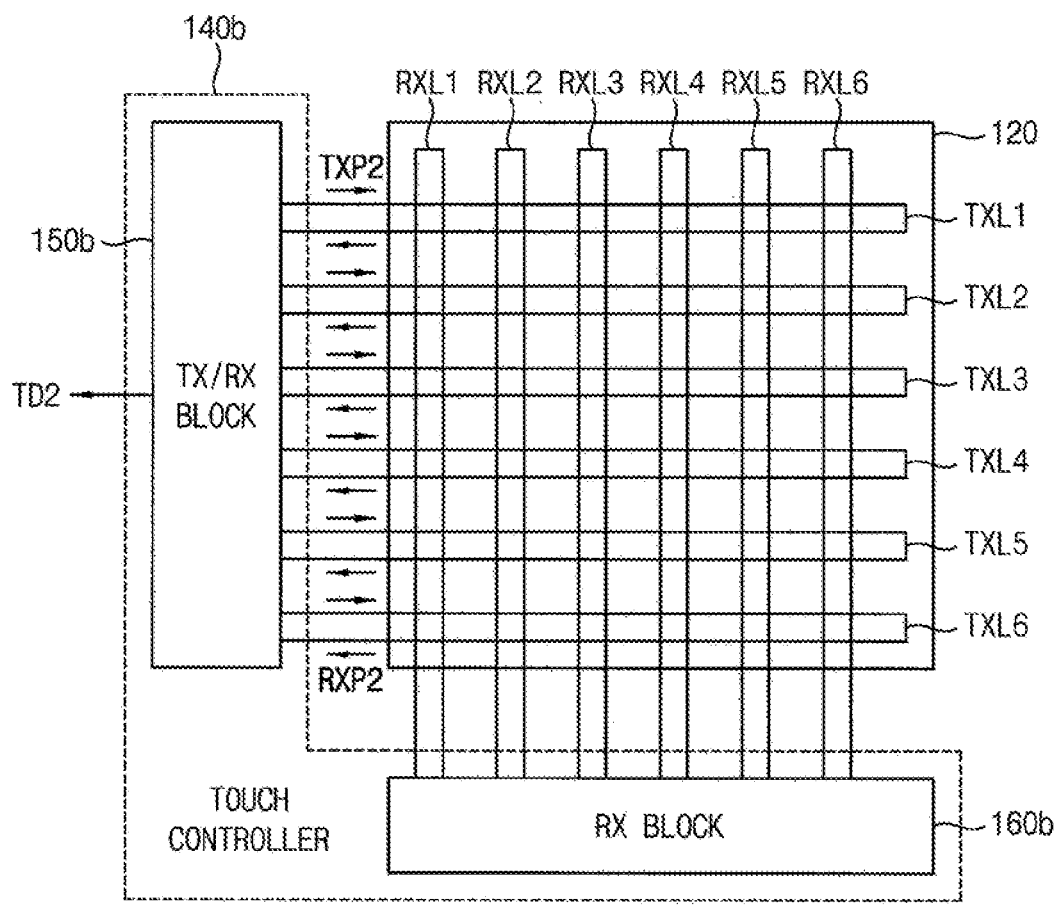
FIG. 5B is a timing diagram that describes another example of an operation of a touch controller in a low power driving mode according to exemplary embodiments.
Figure 5C:
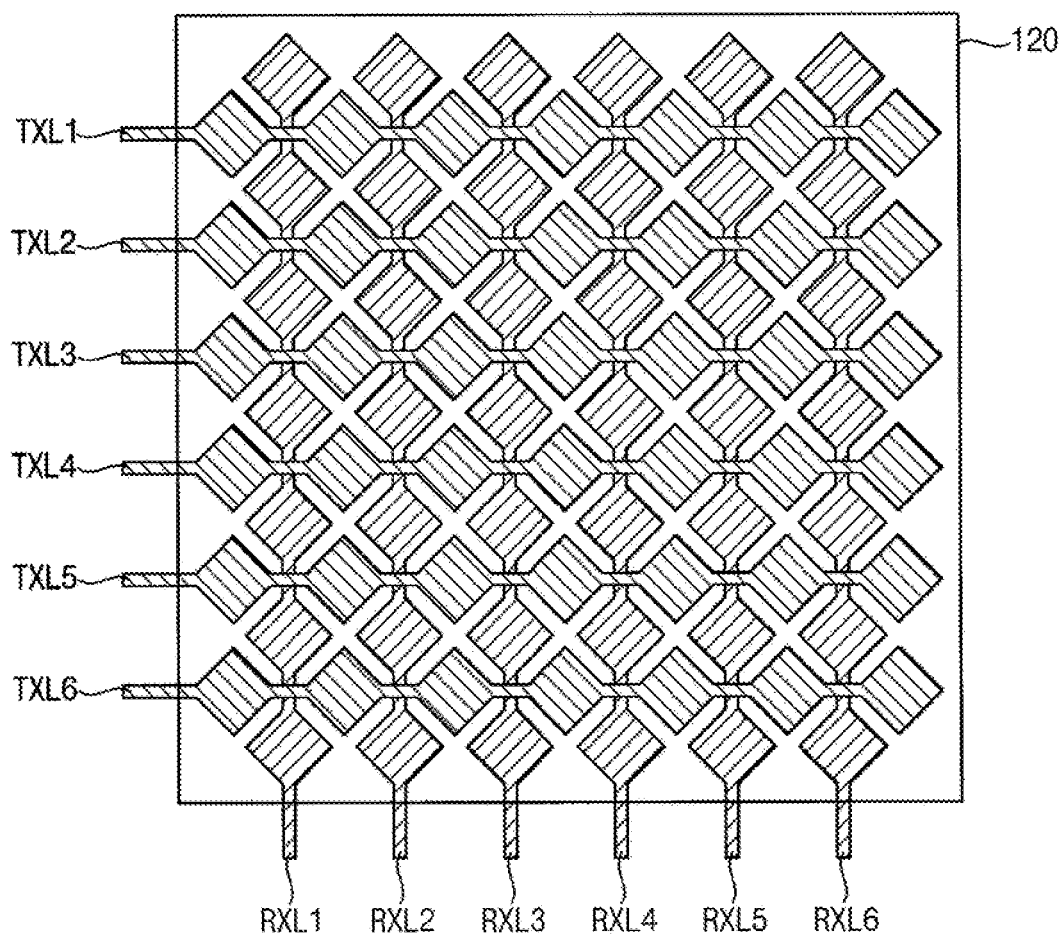
FIG. 5C is a diagram of an example of a touch panel that includes a plurality of driving lines and a plurality of sensing lines according to exemplary embodiments.

FIG. 1 is a block diagram of a display device according to exemplary embodiments, FIG. 2 is a circuit diagram of an example of a pixel included in a display device according to exemplary embodiments, FIG. 3A is a timing diagram that describes an example of an operation of a display driver in a normal driving mode according to exemplary embodiments, FIG. 3B is a timing diagram that describes an example of an operation of a display driver in a low power driving mode according to exemplary embodiments, FIG. 4A is a timing diagram that describes an example of an operation of a touch controller in a normal driving mode according to exemplary embodiments, FIG. 4B is a timing diagram that describes an example of an operation of a touch controller in a low power driving mode according to exemplary embodiments, FIG. 5A is a timing diagram that describes another example of an operation of a touch controller in a normal driving mode according to exemplary embodiments, FIG. 5B is a timing diagram that describes another example of an operation of a touch controller in a low power driving mode according to exemplary embodiments, and FIG. 5C is a diagram of an example of a touch panel that includes a plurality of driving lines and a plurality of sensing lines according to exemplary embodiments.

Referring to FIG. 1, according to exemplary embodiments, a display device 100 includes a display panel 110 that includes a plurality of pixels PX, a touch panel 120 that includes a plurality of driving lines and a plurality of sensing lines, a display driver 130 that drives the display panel 110, and a touch controller 140 that drives the touch panel 120.

According to exemplary embodiments, the display panel 110 is driven by the display driver 130 to display an image. The display panel 110 includes a plurality of data lines, a plurality of scan lines, and the plurality of pixels PX coupled to the plurality of data lines and the plurality of scan lines. In some exemplary embodiments, the display panel 110 further includes a plurality of emission control lines. In some exemplary embodiments, each pixel PX includes an organic light emitting diode, and the display panel 110 is an organic light emitting diode display panel. However, embodiments of the display panel 110 are not limited to an organic light emitting diode display panel. For example, the display panel 110 may be a liquid crystal display (LCD) panel, a light emitting diode (LED) panel, a field emission display (FED) panel, or etc.

In some exemplary embodiments, as illustrated in FIG. 2, each pixel PX includes first through fourth transistors T1, T2, T3 and T4, a storage capacitor CST and an organic light emitting diode OLED. The second transistor T2 transmits a data signal SD received through a data line DL in response to a scan signal SCAN(N). The storage capacitor CST stores the data signal SD received from the second transistor T2. The first transistor T1 generates a driving current based on the data signal SD stored in the storage capacitor CST. The third transistor T3 selectively forms a current path from a line of a first power supply voltage ELVDD to a line of a second power supply voltage ELVSS in response to an emission control signal EM(N). The organic light emitting diode OLED emits light based on the driving current generated by the first transistor T1 while the third transistor T3 is turned on. The fourth transistor T4 connects the pixel PX to a pixel characteristic sensing line SL in response to a next scan line, e.g., the scan signal for the next pixel row, SCAN(N+1). Accordingly, a characteristic of the pixel PX can be detected through the pixel characteristic sensing line SL. In some exemplary embodiments, as illustrated in FIG. 2, each pixel PX is a hybrid pixel, or a hybrid oxide poly (HOP) pixel, that includes both PMOS transistors T1 and T3 and NMOS transistor T2 and T4. For example, the PMOS transistors T1 and T3 are low temperature polycrystalline silicon (LTPS) transistors, and the NMOS transistor T2 and T4 are oxide transistors. Although FIG. 2 illustrates a 4T1C pixel structure that includes fourth transistors T1, T2, T3 and T4 and one capacitor CST, the pixel PX according to exemplary embodiments is not limited to the 4T1C pixel structure. For example, the pixel PX may have any pixel structure that includes two or more transistors and one or more capacitors.

According to exemplary embodiments, the display driver 130 drives the display panel 110 based on input image data IDAT and a control signal CTRL provided from a host processor, e.g., a graphic processing unit (GPU, or an application processor 200 that includes the GPU. In some exemplary embodiments, the input image data IDAT is RGB data that includes red image data, green image data and blue image data. In some exemplary embodiments, the control signal CTRL includes, but is not limited to, an input data enable signal, a master clock signal, a vertical synchronization signal, a horizontal synchronization signal, or etc. The display driver 130 generates a display panel driving signal DPS based on the input image data IDAT and the control signal CTRL, and drives the display panel 110 by providing the display panel driving signal DPS to the display panel 110. In some exemplary embodiments, the display panel driving signal DPS includes scan signals (SCAN(N) and SCAN(N+1) in FIG. 2), a data signal (SD in FIG. 2) and an emission control signal (EM(N) in FIG. 2), and the display driver 130 includes, but is not limited to, a scan driver that provides the scan signals SCAN(N) and SCAN(N+1) to the display panel 110, a data driver that provides the data signal SD to the display panel 110, an emission driver that provides the emission control signal EM(N) to the display panel 110, and a timing controller that controls timings of the scan driver, the data driver and the emission driver.

The display device 100 according to exemplary embodiments supports not only a normal driving mode, but also a low power driving mode for reducing power consumption. For example, once the display device 100 is powered on, the display device 100 first operates in normal driving mode, and a driving mode of the display device 100 changes or switches from the normal driving mode to a low power driving mode when a predetermined criterion is satisfied. In some exemplary embodiments, when a still image is displayed by the display panel 110, the driving mode of the display device changes from normal driving mode to low power driving mode. In an example, when input image data IDAT representing a still image is received, the host processor 200 provides the display driver 130 with the input image data IDAT and the control signal CTRL suitable for low power driving mode. In this case, the host processor 200 transmits the input image data IDAT for the still image to the display driver 130 at a relatively low display frame rate. In another example, the host processor 200 transmits the input image data IDAT for the still image to the display driver 130 at a normal display frame rate, and the display driver 130 drives the display panel 110 at a relatively low display frame rate by detecting the still image represented by the input image data IDAT. In other exemplary embodiments, when an electronic device, such as a smart phone, a tablet computer, a digital TV, etc., that includes the display device 100 is in a sleep state, the driving mode of the display device changes from normal driving mode to low power driving mode.

According to exemplary embodiments, the display driver 130 drives the display panel 110 at a first display frame rate in normal driving mode, and drives the display panel 110 at a second display frame rate lower than the first display frame rate in low power driving mode. In some exemplary embodiments, the first display frame rate may be, but not be limited to, about 60 Hz, about 120 Hz, etc., and the second display frame rate may be, but not be limited to, about 1 Hz, about 2 Hz, about 5 Hz, about 10 Hz, etc.

For example, according to exemplary embodiments, as illustrated in FIG. 3A and FIG. 3B, the first display frame rate in normal driving mode is about 120 Hz, and the second display frame rate in low power driving mode is about 1 Hz. In this case, the display driver 130 drives the display panel 110 with 120 display frames DF1, DF2, . . . , DF120 for about one second. In normal driving mode, as illustrated in FIG. 3A, the display driver 130 drives the display panel 110 in a progressive emission method by sequentially providing scan signals SCAN(1) and SCAN(2) and emission control signals EM(1) and EM(2) and by providing data signals D1, D2, ..., DM in synchronization with the scan signals SCAN(1) and SCAN(2). In low power driving mode, as illustrated in FIG. 3B, the display driver 130 drives the display panel 110 at the second display frame rate of about 1 Hz by providing the data signals D1, D2, ..., DM, the scan signals SCAN(1) and SCAN(2) and the emission control signals EM(1) and EM(2) in only one display frame DF1 of the 120 display frames DF1, DF2, ..., DF120. Accordingly, power consumption of the display device 100 is reduced in the low power driving mode.

According to exemplary embodiments, the touch panel 120 is a capacitive touch panel that senses a capacitance change caused by a touch of a conductive object, such as a finger, a stylus pen, etc. For example, as illustrated in FIG. 4A through 5B, the touch panel 120 includes a plurality of driving lines TXL1 through TXL6 extending in a first direction, and a plurality of sensing lines RXL1 through RXL6 extending in a second direction substantially perpendicular to the first direction. In some exemplary embodiments, a layer at which the plurality of driving lines TXL1 through TXL6 are formed differs from a layer at which the plurality of sensing lines RXL1 through RXL6 are formed. In this case, as illustrated in FIG. 4A through 5B, the plurality of driving lines TXL1 through TXL6 and the plurality of sensing lines RXL1 through RXL6 are straight lines. In other exemplary embodiments, the plurality of driving lines TXL1 through TXL6 and the plurality of sensing lines RXL1 through RXL6 are formed in substantially the same layer. For example, as illustrated in FIG. 5C, each of the plurality of driving lines TXL1 through TXL6 and the plurality of sensing lines RXL1 through RXL6 may have a structure where a plurality of consecutive polygons having diamond shapes are connected, but the structure of each line TXL1 through TXL6 and RXL1 through RXL6 may not be limited to the plurality of consecutive polygons. Further, according to exemplary embodiments, the touch panel 120 may be an add-on type touch panel that is attached on the display panel 110, or an embedded type touch panel formed within the display panel 110. For example, the touch panel 120 can be, but is not limited to, an on-cell type embedded touch panel, or an in-cell type embedded touch panel.

According to exemplary embodiments, the touch controller 140 detects a touch or proximity of a conductive object by driving the touch panel 120. In the display device 100 according to exemplary embodiments, the touch controller 140 drives the touch panel 120 in a mutual capacitance sensing method in the normal driving mode, and drives the touch panel 120 in a self capacitance sensing method in the low power driving mode. For example, in normal driving mode, the touch controller 140 perform a touch sensing operation using the mutual capacitance sensing method by sensing changes of mutual capacitances between the plurality of driving lines TXL1 through TXL6 and the plurality of sensing lines RXL1 through RXL6.

Further, in the low power driving mode, the touch controller 140 performs a touch sensing operation using the self capacitance sensing method by sensing changes of self capacitances, e.g., capacitances between the plurality of sensing lines RXL1 through RXL6 and a conductive object, of the plurality of sensing lines RXL1 through RXL6 or by sensing changes of self capacitances, e.g., capacitances between the plurality of driving lines TXL1 through TXL6 and a conductive object, of the plurality of driving lines TXL1 through TXL6.

In some exemplary embodiments, the touch controller 140 detects proximity of a conductive object to the touch panel 120 by driving the touch panel 120 with the self capacitance sensing method in the low power driving mode. If the proximity of a conductive object is detected, the driving mode of the display device 100 changes from the low power driving mode to the normal driving mode. The touch panel 120 using the mutual capacitance sensing method can detect the touch of a conductive object when the touch panel 120 is touched by the conductive object, but the touch panel 120 using the self capacitance sensing method can detect the proximity of a conductive object when the conductive object is in proximity to the touch panel 120 before the touch panel 120 is touched by the conductive object. Accordingly, the display device 100 according to exemplary embodiments can rapidly change the driving mode from the low power driving mode to the normal driving mode by detecting the proximity of a conductive object before the touch of conductive object.

In some exemplary embodiments, to provide both the mutual capacitance sensing method and the self capacitance sensing method, as illustrated in FIG. 4A and FIG. 4B, the touch controller 140a includes a transmitting block 150a coupled to the plurality of driving lines TXL1 through TXL6, and a transmitting/receiving block 160a coupled to the plurality of sensing lines RXL1 through RXL6.

As illustrated in FIG. 4A, according to exemplary embodiments, in the normal driving mode, the transmitting block 150a sequentially transmits first driving signals TXP1 to the plurality of driving lines TXL1 through TXL6. For example, each first driving signal TXP1 includes, but is not limited to, one or more consecutive voltage pulses. For example, each first driving signal TXP1 may have various forms, such as a sinusoidal wave form, a triangular wave form, etc. The transmitting/receiving block 160a receives first sensing signals RXP1 induced in the plurality of sensing lines RXL1 through RXL6 by capacitive coupling between the driving lines TXL1 through TXL6 to which the first driving signal TXP1 is transmitted and the plurality of sensing lines RXL1 through RXL6. The transmitting/receiving block 160a generates first touch data TD1 that represents a touch position of the conductive object determined by sensing changes of mutual capacitances between each driving line TXL1 through TXL6 and the plurality of sensing lines RXL1 through RXL6 based on the first sensing signals RXP1, and transmits the first touch data TD1 to the host processor 200. For example, when the touch panel 120 is touched by a conductive object, the mutual capacitance between the driving line and the sensing line whose locations correspond to the position of the touch changes, e.g., decreases. In this case, when the first driving signal TXP1 is transmitted to the driving line corresponding to the touch position, the first sensing signal RXP1, or the charge magnitude induced in the sensing line corresponding to the position of the touch decreases. The transmitting/receiving block 160a senses the position of the decreased mutual capacitance or the position of the touch by detecting the decreased charge magnitude.

As illustrated in FIG. 4B, according to exemplary embodiments, in the low power driving mode, the transmitting/receiving block 160a transmits second driving signals TXP2 to the plurality of sensing lines RXL1 through RXL6. In some exemplary embodiments, the touch controller 140a detects only presence of a conductive object in proximity to the touch panel 120 using the plurality of sensing lines RXL1 through RXL6, and does not detect the position of the conductive object. In this case, the transmitting/receiving block 160*a* substantially simultaneously transmits the second driving signals TXP2 to the plurality of sensing lines RXL1 through RXL6. For example, each driving signal TXP2 includes, but is not limited to, one or more current pulses. The transmitting/receiving block 160*a* receives second sensing signals RXP2 from the plurality of sensing lines RXL1 through RXL6 to which the second driving signals TXP2 are transmitted, determines whether the conductive object is in proximity by sensing changes of self capacitances of the plurality of sensing lines RXL1 through RXL6 based on the second sensing signals RXP2, and generates second touch data TD2 that represents whether the conductive object is in proximity. For example, when the conductive object is in proximity to the touch panel 120, the self capacitances of the plurality of sensing lines RXL1 through RXL6 changes, e.g., increases. In this case, while the second driving signals TXP2 are transmitted to the plurality of sensing lines RXL1 through RXL6, the second sensing signals RXP2, or voltages of the plurality of sensing lines RXL1 through RXL6, are slowly increased. The transmitting/receiving block 160*a* senses the increase of the self capacitances or the proximity of the conductive object by detecting the slow increase of the voltages of the plurality of sensing lines RXL1 through RXL6. If the proximity of the conductive object is sensed, the transmitting/receiving block 160*a* transmits to the host processor 200 the second touch data TD2 that indicates the proximity of the conductive object, and the host processor 200, or the display device 100, changes the driving mode of the display device 100 to normal driving mode in response to the second touch data TD2 indicating the proximity of the conductive object. Accordingly, when a conductive object is in proximity to the touch panel 120, or before the touch panel 120 is touched by the conductive object, the driving mode of the display device 100 can rapidly change or switch from low power driving mode to normal driving mode.

In other exemplary embodiments, to provide both the mutual capacitance sensing method and the self capacitance sensing method, as illustrated in FIG. 5A and FIG. 5B, the touch controller 140*b* includes a transmitting/receiving block 150*b* coupled to the plurality of driving lines TXL1 through TXL6, and a receiving block 160*b* coupled to the plurality of sensing lines RXL1 through RXL6.

As illustrated in FIG. 5A, according to exemplary embodiments, in normal driving mode, the transmitting/receiving block 150*b* sequentially transmits first driving signals TXP1 to the plurality of driving lines TXL1 through TXL6. The receiving block 160*b* receives first sensing signals RXP1 from the plurality of sensing lines RXL1 through RXL6, generates first touch data TD1 that represents a touch position of a conductive object determined by sensing changes of mutual capacitances between the plurality of driving lines TXL1 through TXL6 and the plurality of sensing lines RXL1 through RXL6 from the first sensing signals RXP1, and transmits the first touch data TD1 to the host processor 200.

As illustrated in FIG. 5B, according to exemplary embodiments, in low power driving mode, the transmitting/receiving block 150*b* substantially simultaneously transmits second driving signals TXP2 to the plurality of driving lines TXL1 through TXL6. Further, the transmitting/receiving block 150*b* receives second sensing signals RXP2 from the plurality of driving lines TXL1 through TXL6 to which the second driving signals TXP2 are transmitted, determines whether the conductive object is in proximity by sensing changes of self capacitances of the plurality of driving lines TXL1 through TXL6 based on the second sensing signals RXP2, and generates second touch data TD2 that represents whether the conductive object is in proximity. If proximity of the conductive object is sensed, the transmitting/receiving block 150*b* transmits to the host processor 200 the second touch data TD2 indicating the proximity of the conductive object, and the host processor 200, or the display device 100, changes the driving mode of the display device 100 to normal driving mode in response to the second touch data TD2 indicating the proximity of the conductive object. Accordingly, when a conductive object is in proximity to the touch panel 120, or before the touch panel 120 is touched by the conductive object, the driving mode of the display device 100 can rapidly change or switch) from low power driving mode to normal driving mode.

As described above, the display device 100 according to exemplary embodiments drives, in low power driving mode, the display panel 110 at the second display frame rate lower than the first display frame rate of the normal driving mode, thereby reducing the power consumption. Further, the display device 100 according to exemplary embodiments drives the touch panel 120 with the self capacitance sensing method in low power driving mode, and can rapidly change the driving mode of the display device 100 from low power driving mode to normal driving mode when proximity of a conductive object is detected before the touch of the conductive object.

Figure 6:
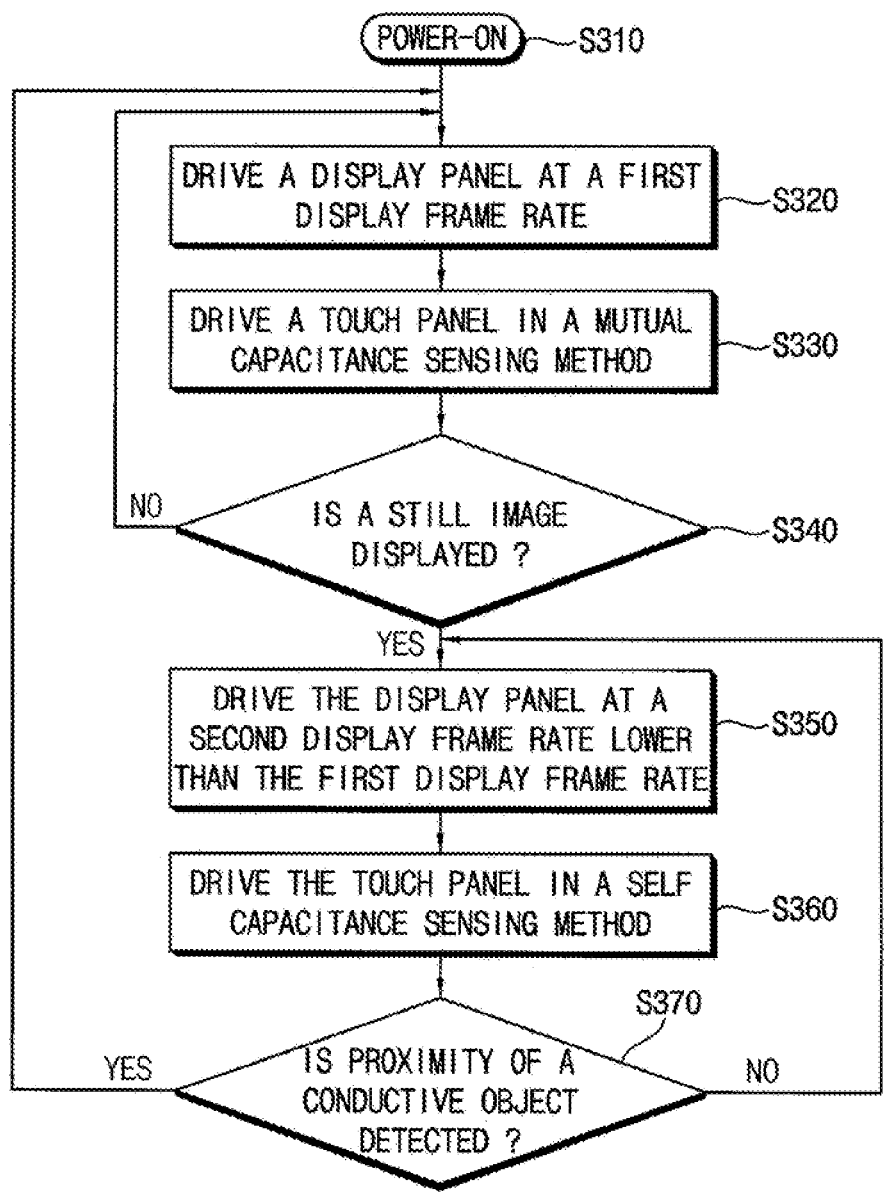
FIG. 6 is a flowchart of a method of operating a display device according to exemplary embodiments.

FIG. 6 is a flowchart illustrating a method of operating a display device according to exemplary embodiments.

Referring to FIG. 1 and FIG. 6, according to exemplary embodiments, when a display device 100 is powered on (S310), the display device 100 operates in a normal driving mode. In normal driving mode, the display driver 130 drives a display panel 110 at a first display frame rate (S320), and the touch controller 140 drives a touch panel 120 with a mutual capacitance sensing method (S330). Until a still image is displayed at the display panel 110 (S340: NO), a driving mode of the display device 100 is maintained in the normal driving mode.

According to exemplary embodiments, if the still image is displayed by the display panel 110 (S340: YES), the driving mode of the display device 100 changes from the normal driving mode to a low power driving mode. In other exemplary embodiments, when an electronic device that includes the display device 100 is in a sleep state, the driving mode of the display device 100 changes from normal driving mode to the low power driving mode.

According to exemplary embodiments, in the low power driving mode, the display driver 130 drives the display panel 110 at a second display frame rate lower than the first display frame rate (S350), and the touch controller 140 drives the touch panel 120 with a self capacitance sensing method (S360). Accordingly, the touch controller 140 can detect that a conductive object is in proximity to the touch panel 120. Until the proximity of the conductive object is detected (S370: NO), the driving mode of the display device 100 is maintained in the low power driving mode. If the proximity of the conductive object is detected (S370: YES), the driving mode of the display device 100 changes from low power driving mode to the normal driving mode. Accordingly, in a method of operating the display device 100 according to exemplary embodiments, the touch panel 120 is driven with the self capacitance sensing method in the low power driving mode, and can rapidly change the driving mode of the display device 100 from the low power driving mode to a normal driving mode when the proximity of a conductive object is detected before the touch of the conductive object.

Figure 7:
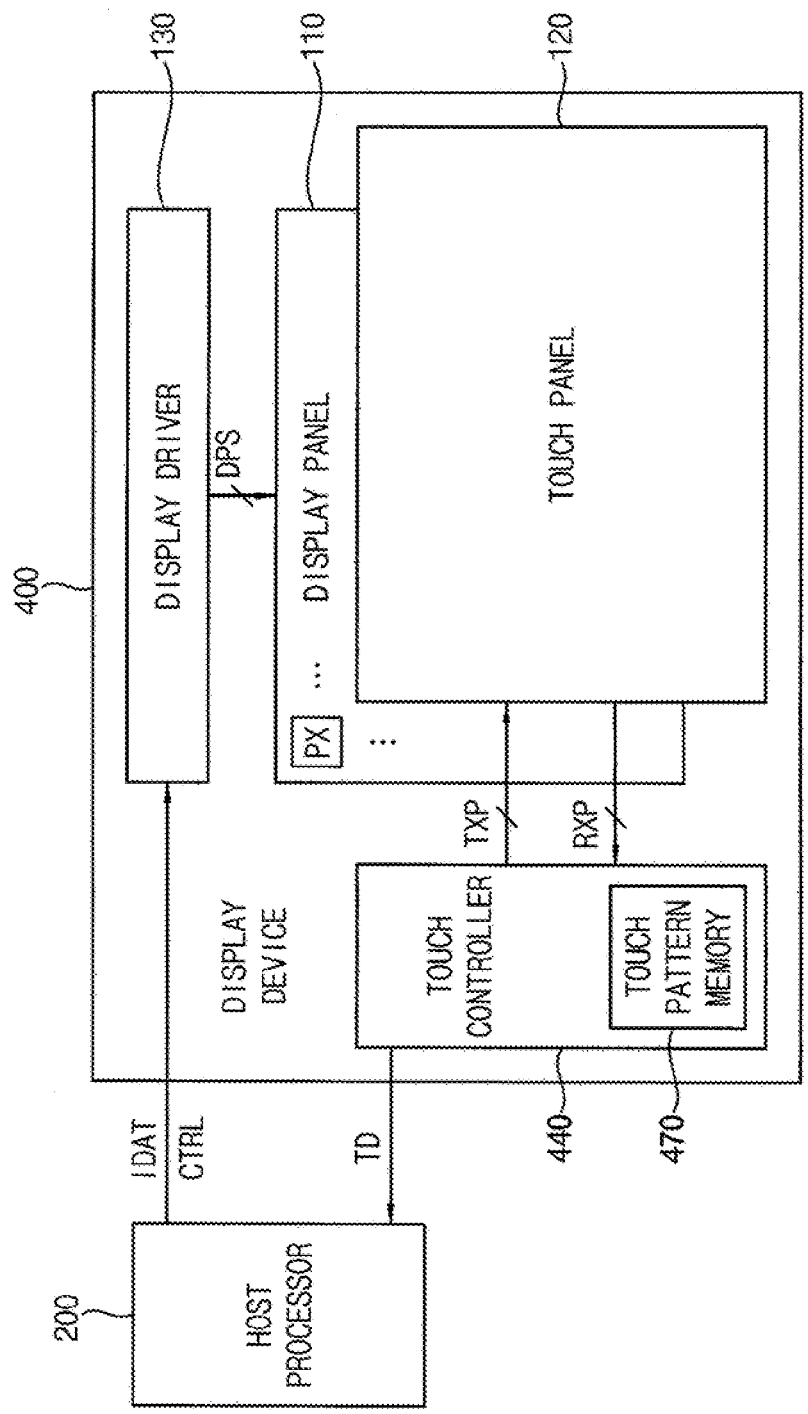
FIG. 7 is a block diagram of a display device according to exemplary embodiments.
Figure 8A:
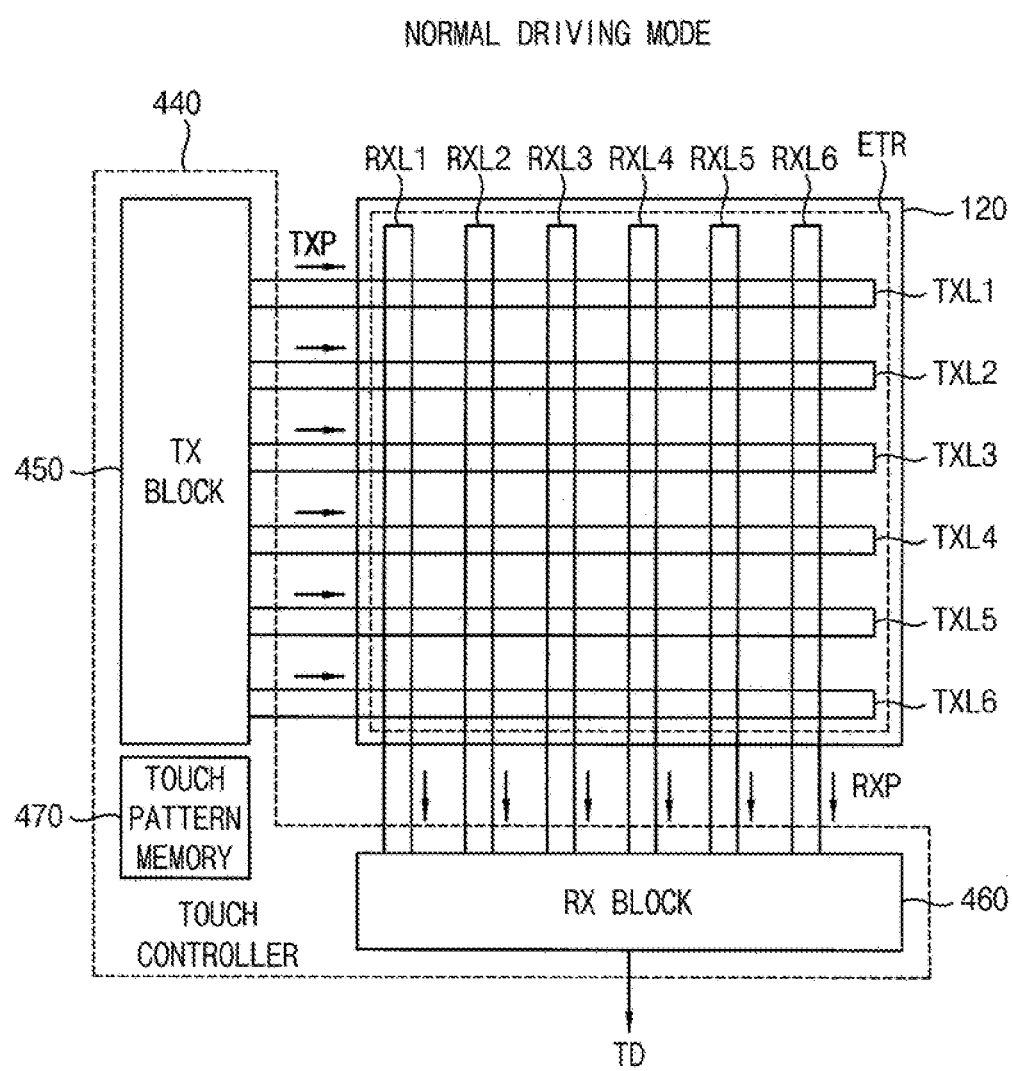
FIG. 8A is a timing diagram that describes still another example of an operation of a touch controller in a normal driving mode according to exemplary embodiments.
Figure 8B:
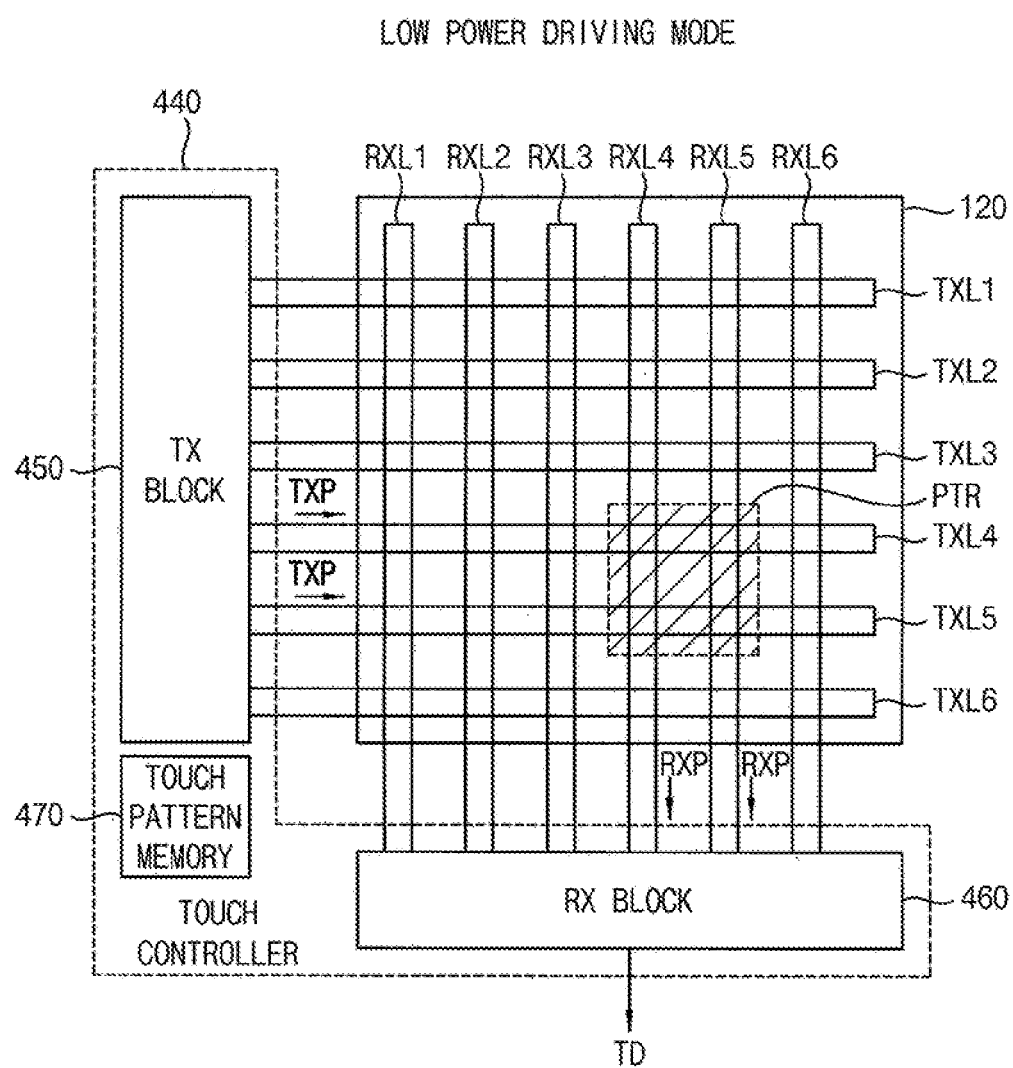
FIG. 8B is a timing diagram that describes still another example of an operation of a touch controller in a low power driving mode according to exemplary embodiments.

FIG. 7 is a block diagram illustrating a display device according to exemplary embodiments, FIG. 8A is a timing diagram that describes another example of an operation of a touch controller in a normal driving mode according to exemplary embodiments, and FIG. 8B is a timing diagram that describes another example of an operation of a touch controller in a low power driving mode according to exemplary embodiments.

Referring to FIG. 7, according to exemplary embodiments, a display device 400 includes a display panel 110, a touch panel 120, a display driver 130 and a touch controller 440. The display device 400 of FIG. 7 has a configuration and operation that are similar to a display device 100 of FIG. 1, except for a configuration and an operation of the touch controller 440.

According to exemplary embodiments, the touch controller 440 drives the touch panel 120 using a mutual capacitance sensing method. For example, the touch controller 440 can detect a touch position of a conductive object by sensing changes of mutual capacitances between a plurality of driving lines and a plurality of sensing lines of the touch panel 120. In the display device 400 according to exemplary embodiments, the touch controller 440 drives an entire touch region of the touch panel 120 in a normal driving mode where the display panel 110 is driven at a first display frame rate, and drives a partial touch region of the touch panel 120 in a low power driving mode where the display panel 110 is driven at a second display frame rate lower than the first display frame rate. In some exemplary embodiments, the partial touch region is determined based on a touch pattern stored in a touch pattern memory 470 included in the touch controller 440. For example, the touch pattern stored in the touch pattern memory 470 can represent previous touch positions, and the partial touch region is a region that includes the most touched positions of the previously touched positions. Further, in some exemplary embodiments, the touch pattern includes, but is not limited to, touch positions that occurred when a driving mode of the display device 400 changes from low power driving mode to normal driving mode. In other exemplary embodiments, the touch pattern is stored and managed by a host processor 200, and the host processor 200 determines the partial touch region based on touch patterns.

For example, according to exemplary embodiments, as illustrated in FIG. 8A and FIG. 8B, the touch controller 440 includes a transmitting block 450 coupled to the plurality of driving lines TXL1 through TXL6, a receiving block 460 coupled to the plurality of sensing lines RXL1 through RXL6, and the touch pattern memory 470 that stores the touch pattern.

As illustrated in FIG. 8A, according to exemplary embodiments, in normal driving mode, to drive the entire touch region ETR of the touch panel 120, the transmitting block 450 sequentially transmits driving signals TXP to the plurality of driving lines TXL1 through TXL6 that correspond to the entire touch region ETR. For example, each driving signal TXP includes, but is not limited to, one or more consecutive voltage pulses. The receiving block 460 receives sensing signals RXP from the plurality of sensing lines RXL1 through RXL6 that correspond to the entire touch region ETR. The receiving block 460 generates touch data TD that represents the touch position of the conductive object determined by sensing changes of mutual capacitances between the plurality of driving lines TXL1 through TXL6 and the plurality of sensing lines RXL1 through RXL6 based on the sensing signals RXP, and transmits the touch data TD to the host processor 200.

As illustrated in FIG. 8B, according to exemplary embodiments, in low power driving mode, to drive the partial touch region PTR determined based on the touch pattern stored in the touch pattern memory 470, the transmitting block 450 transmits driving signals TXP only to those driving lines that correspond to the partial touch region PTR. In FIG. 8B, the corresponding driving lines are TXL4 and TXL5. Further, the receiving block 460 receives sensing signals RXP only from those sensing lines that correspond to the partial touch region PTR. In FIG. 8B, the corresponding driving lines are RXL4 and RXL5. The receiving block 460 determines the touch position of the conductive object by sensing changes of mutual capacitances between the driving lines TXL4 and TXL5 and the sensing lines RXL4 and RXL5 corresponding to the partial touch region PTR based on the sensing signals RXP, generates touch data TD that represents the touch position of the conductive object, and transmits the touch data TD to the host processor 200. As described above, since not the entire touch region ETR, but the partial touch region PTR determined based on the touch pattern is driven in low power driving mode, power consumption in low power driving mode can be further reduced.

In some exemplary embodiments, the touch controller 440 does not drive a remaining touch region other than the partial touch region PTR in low power driving mode. In other exemplary embodiments, in low power driving mode, the touch controller 440 drives the partial touch region PTR at a first touch frame rate, and drives the remaining touch region of the touch panel 120 in a second touch frame rate lower than the first touch frame rate. For example, the first touch frame rate ranges from about 60 Hz to about 120 Hz, and the second touch frame rate ranges from about 1 Hz to about 10 Hz. For example, in a case when the first touch frame rate is about 120 Hz, and the second touch frame rate is about 1 Hz, the touch controller 440 drives the touch panel 120 with 120 touch frames for about one second, activates all of the plurality of driving lines TXL1 through TXL6 and all of the plurality of sensing lines RXL1 through RXL6 that correspond to the entire touch region ETR in one of the 120 touch frames, and activates only the driving lines TXL4 and TXL5 and the sensing lines RXL4 and RXL5 that correspond to the partial touch region PTR in the remaining 119 touch frames. According to exemplary embodiments, the first touch frame rate is the same as or different from the first display frame rate for the display panel 110 in normal driving mode. Further, according to exemplary embodiments, the second touch frame rate is the same as or different from the second display frame rate for the display panel 110 in low power driving mode.

In exemplary embodiments, if a touch to the touch panel 120 is detected in low power driving mode, the driving mode of the display device 400 changes from low power driving mode to normal driving mode.

As described above, the display device 400 according to exemplary embodiments drives, in low power driving mode, the display panel 110 at the second display frame rate lower than the first display frame rate of the normal driving mode, thereby reducing the power consumption. Further, the display device 400 according to exemplary embodiments drives the partial touch region PTR of the touch panel 120 in low power driving mode, thereby further reducing the power consumption in the low power driving mode.

Figure 9:
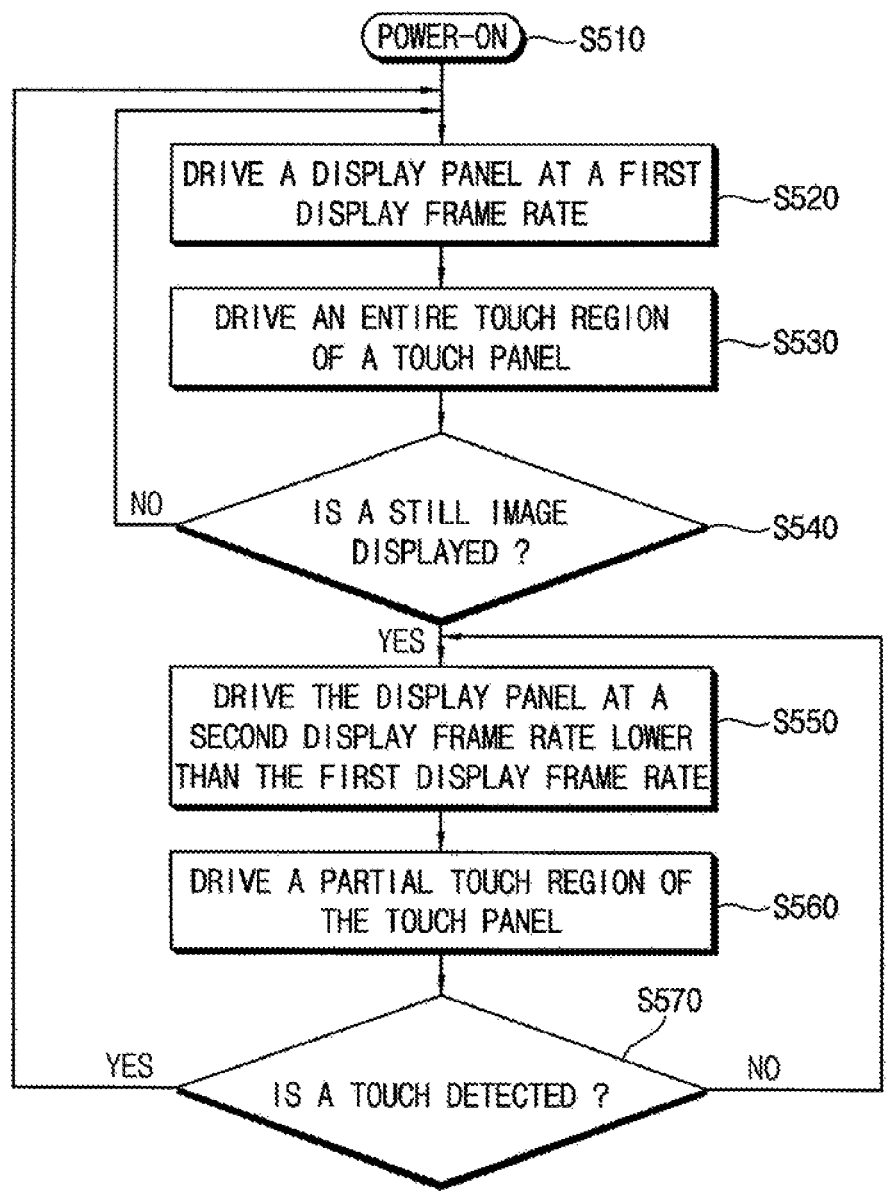
FIG. 9 is a flowchart of a method of operating a display device according to exemplary embodiments.

FIG. 9 is a flowchart that illustrates a method of operating a display device according to exemplary embodiments.

Referring to FIG. 7 and FIG. 9, according to exemplary embodiments, when a display device 400 is powered on (S510), the display device 400 operates in a normal driving mode. In normal driving mode, a display driver 130 drives a display panel 110 at a first display frame rate (S520), and a touch controller 440 drives an entire touch region of a touch panel 120 (S530). Until a still image is displayed by the display panel 110 (S540: NO), the driving mode of the display device 400 is maintained as the normal driving mode.

According to exemplary embodiments, if a still image is displayed at the display panel 110 (S540: YES), the driving mode of the display device 400 changes from normal driving mode to a low power driving mode. In other exemplary embodiments, when an electronic device that includes the display device 400 enters a sleep state, the driving mode of the display device 400 changes from the normal driving mode to the low power driving mode.

According to exemplary embodiments, in the low power driving mode, the display driver 130 drives the display panel 110 at a second display frame rate lower than the first display frame rate (S550), and the touch controller 440 drives a partial touch region of the touch panel 120 determined based on a touch pattern that represents previous touch positions (S560). In some exemplary embodiments, the touch controller 440 does not drive a remaining touch region other than the partial touch region of the touch panel 120. In other exemplary embodiments, the touch controller 440 drives the partial touch region at a first touch frame rate, and drives the remaining touch region in a second touch frame rate lower than the first touch frame rate. Accordingly, power consumption in the low power driving mode can be further reduced. Until a touch to the touch panel 120 is detected (S570: NO), the driving mode of the display device 400 is maintained in the low power driving mode. If a touch is detected (S570: YES), the driving mode of the display device 400 changes from low power driving mode to normal driving mode.

Figure 10:
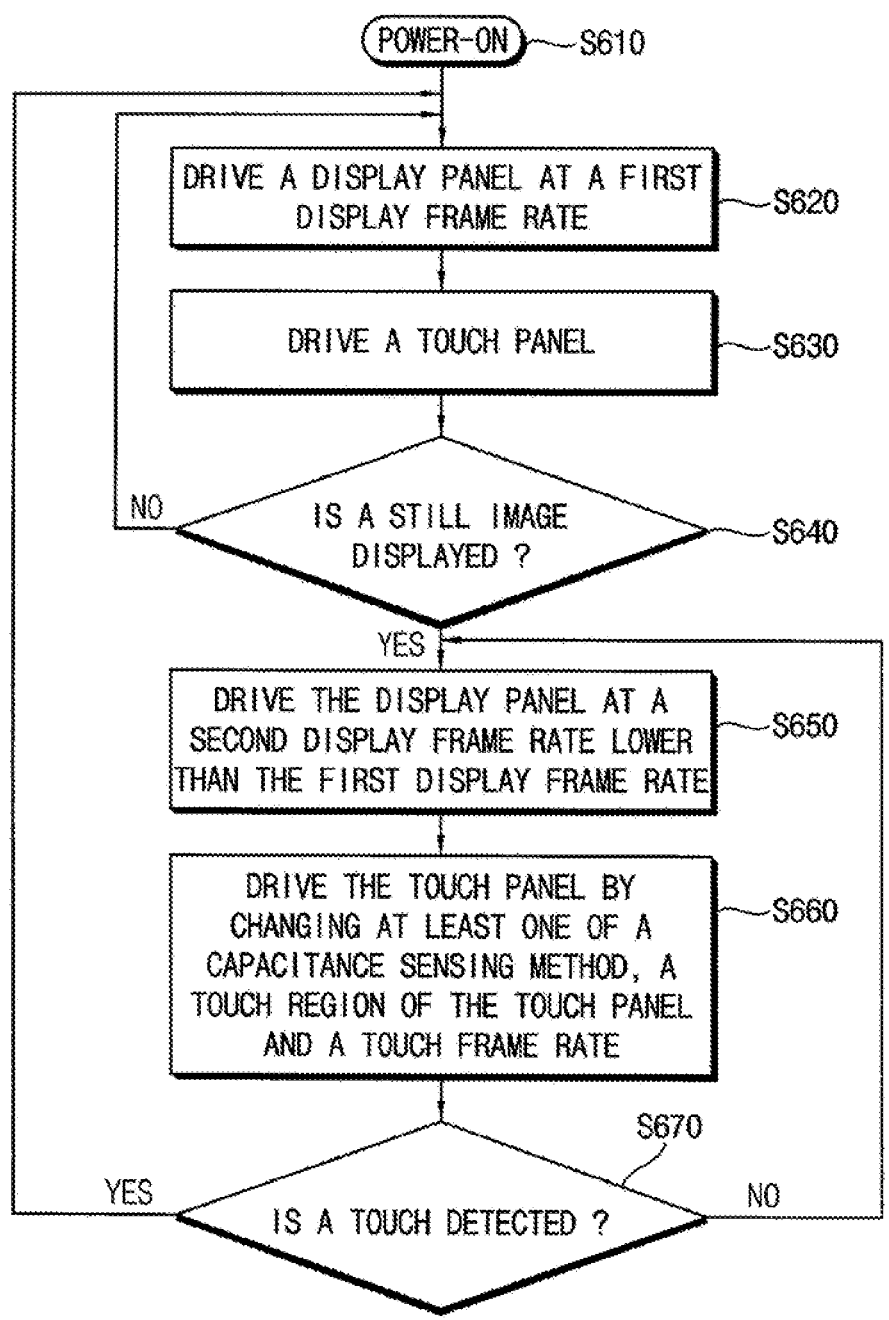
FIG. 10 is a flowchart of a method of operating a display device according to exemplary embodiments.

FIG. 10 is a flowchart illustrating a method of operating a display device according to exemplary embodiments.

Referring to FIG. 10, when a display device according to exemplary embodiments is powered on (S610), the display device operates in a normal driving mode. In normal driving mode, a display driver drives a display panel at a first display frame rate (S620), and a touch controller drives a touch panel (S630). For example, the touch controller drives an entire touch region of the touch panel at a normal touch frame rate using a mutual capacitance sensing method. Until a still image is displayed by the display panel (S640: NO), a driving mode of the display device is maintained in the normal driving mode.

According to exemplary embodiments, if a still image is displayed by the display panel (S640: YES), or if an electronic device that includes the display device is in a sleep state, the driving mode of the display device changes from the normal driving mode to a low power driving mode.

According to exemplary embodiments, in a low power driving mode, the display driver drives the display panel at a second display frame rate lower than the first display frame rate (S650), and the touch controller drives the touch panel by changing at least one of the sensing method, the touch region of the touch panel or the touch frame rate (S660).

In some exemplary embodiments, the touch controller drives the touch panel using the mutual capacitance sensing method in normal driving mode, and drives the touch panel using a self capacitance sensing method in low power driving mode by changing the sensing method from the mutual capacitance sensing method to the self capacitance sensing method. In other exemplary embodiments, the touch controller drives the entire touch region of the touch panel in normal driving mode, and drives a partial touch region of the touch panel in low power driving mode by changing the touch region from the entire touch region to the partial touch region. In other exemplary embodiments, the touch controller drives the touch panel at a first touch frame rate in the normal driving mode, and drives the touch panel at a second touch frame rate lower than the first touch frame rate in the low power driving mode by changing the touch frame rate from the first touch frame rate to the second touch frame rate. In still other exemplary embodiments, the touch controller drives an entire touch region of the touch panel at the first touch frame rate in the normal driving mode, drives the partial touch region of the touch panel at the first touch frame rate in the low power driving mode, and drives a remaining touch region other than the partial touch region of the touch panel at the second touch frame rate lower than the first touch frame rate in the low power driving mode.

According to exemplary embodiments, until a touch to the touch panel is detected (S670: NO), the driving mode of the display device is maintained in the low power driving mode. If a touch is detected (S670: YES), the driving mode of the display device changes from the low power driving mode to the normal driving mode.

Figure 11:
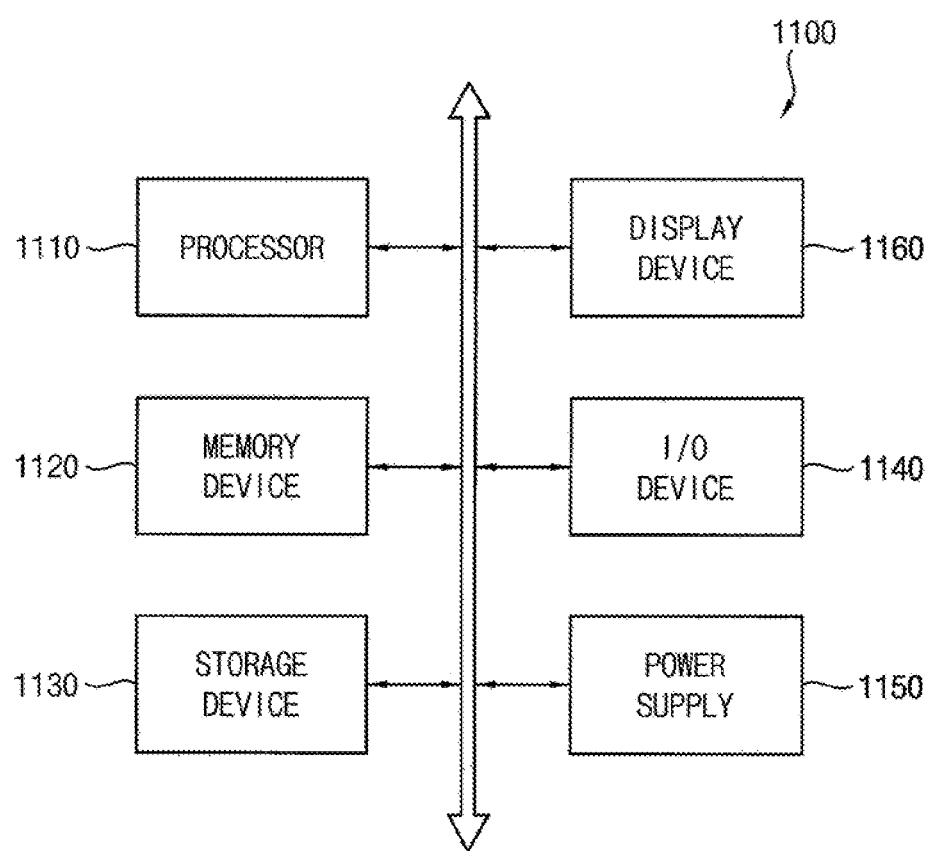
FIG. 11 is a block diagram of an electronic device that includes a display device according to exemplary embodiments.

FIG. 11 is a block diagram that illustrates an electronic device that includes a display device according to exemplary embodiments.

Referring to FIG. 11, according to exemplary embodiments, an electronic device 1100 includes a processor 1110, a memory device 1120, a storage device 1130, an input/output (I/O) device 1140, a power supply 1150, and a display device 1160. The electronic device 1100 further includes a plurality of ports for communicating with a video card, a sound card, a memory card, a universal serial bus (USB) device, other electric devices, etc.

According to exemplary embodiments, the processor 1110 can perform various computing functions or tasks. The processor 1110 may be an application processor (AP), a micro processor, a central processing unit (CPU), etc. The processor 1110 can be coupled to other components via an address bus, a control bus, a data bus, etc. Further, in some exemplary embodiments, the processor 1110 is further coupled to an extended bus such as a peripheral component interconnection (PCI) bus.

According to exemplary embodiments, the memory device 1120 stores data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, or at least one volatile memory device such as a dynamic random access memory (DRAM) device, a static random access memory (SRAM) device, a mobile dynamic random access memory (mobile DRAM) device, etc.

According to exemplary embodiments, the storage device 1130 may be a solid state drive (SSD) device, a hard disk drive (HDD) device, a CD-ROM device, etc. The I/O device 1140 may be an input device such as a keyboard, a keypad, a mouse, a touch screen, etc, and an output device such as a printer, a speaker, etc. The power supply 1150 supplies power for operations of the electronic device 1100. The display device 1160 is coupled to other components through the buses or other communication links.

According to exemplary embodiments, the display device 1160 drives, in a low power driving mode, a display panel at a second display frame rate lower than a first display frame rate of a normal driving mode, thereby reducing power consumption. Further, the display device 1160 changes at least one of a sensing method, a touch region of a touch panel or a touch frame rate when a driving mode changes, thereby suitably driving the touch panel for the low power driving mode.

The inventive concepts can be incorporated into any electronic device 1100 that includes the display device 1160. For example, the inventive concepts can be incorporated into a mobile phone, a smart phone, a tablet computer, a television (TV), a digital TV, a 3D TV, a wearable electronic device, a personal computer (PC), a home appliance, a laptop computer, a personal digital assistant (PDA), a portable multimedia player (PMP), a digital camera, a music player, a portable game console, a navigation device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A display device, comprising:
   a display panel that includes a plurality of pixels;
   a single touch panel that includes a plurality of driving lmes and a plurality of sensing lines;
   a display driver that drives the display panel at a first display frame rate in a normal driving mode, and that drives the display panel at a second display frame rate lower than the first display frame rate in a low power driving mode; and
   a touch controller that drives the touch panel with a mutual capacitance sensing method in the normal driving mode, and that drives the touch panel with a self capacitance sensing method in the low power driving mode,
   wherein the touch controller drives the plurality of driving lines of the touch panel with the self capacitance sensing method in the low power driving mode,
   wherein the touch controller includes:
   a transmitting/receiving block coupled to the plurality of driving lines extending in a first direction, wherein the transmitting/receiving block
      sequentially transmits first driving signals to the plurality of driving lines in the al driving mode, and
      generates second touch data by simultaneously transmitting second driving signals to the plurality of driving lines and by sensing changes of self capacitances of the plurality of driving lines in the low power driving mode; and
   a receiving block coupled to the plurality of sensing lines extending in a second direction substantially perpendicular to the first direction, wherein the receiving block generates first touch data by sensing changes of mutual capacitances between the plurality of driving lines and the plurality of sensing lines in the normal driving mode,
   wherein the display driver receives input image data, and detects a still image represented by the input image data, and
   wherein the touch, controller drives the touch panel with the self capacitance sensing method when the still image is detected.

2. The display device of claim 1, wherein a driving mode of the display device changes from the normal driving mode to the low power driving mode when a still image is displayed by the display panel.

3. The display device of claim 1, wherein a driving mode of the display device changes from the normal driving mode to the low power driving mode when an electronic device that includes the display device is in a sleep state.

4. The display device of claim 1,
   wherein the touch controller detects proximity of a conductive object to the touch panel by driving the touch panel with the self capacitance sensing method in the low power driving mode, and
   wherein a driving mode of the display device changes from the low power driving mode to the normal driving mode when proximity of the conductive object is detected.

5. The display device of claim 1,
   wherein, in the normal driving mode, the touch controller drives an entire touch region of the touch panel, and
   wherein, in the low power driving mode, the touch controller rid yes a partial touch region of the touch panel by changing the touch region from the entire touch region to the partial touch region.

6. The display device of claim 1,
   wherein, in the normal driving mode, the touch controller drives the touch panel at a first touch frame rate, and
   wherein, in the low power driving mode, the touch controller drives the touch panel at a second touch frame rate lower than the first touch frame rate by changing the touch frame rate from the first touch frame rate to the second touch frame rate.

7. The display device of claim 1,
   wherein, in the normal driving mode, the touch controller drives an entire touch region of the touch panel at a first touch frame rate, and
   wherein, in the low power driving mode, the touch controller drives a partial touch region of the touch panel at the first touch frame rate, and drives a remaining touch region other than the partial touch region of the touch panel at a second touch frame rate lower than the first touch frame rate.

\* \* \* \* \*